United States Patent
Lee et al.

(10) Patent No.: US 8,487,351 B2
(45) Date of Patent: Jul. 16, 2013

(54) IMAGE SENSOR AND IMAGE SENSING SYSTEM INCLUDING THE SAME

(75) Inventors: Kyung Ho Lee, Suwon-si (KR); Dong-Yoon Jang, Hwasung-si (KR); Jung Chak Ahn, Yongin-si (KR); Moo Sup Lim, Seoul (KR); Yong Jei Lee, Seongnam-si (KR); Jong Eun Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 892 days.

(21) Appl. No.: 12/591,632

(22) Filed: Nov. 25, 2009

(65) Prior Publication Data

US 2010/0133635 A1    Jun. 3, 2010

(30) Foreign Application Priority Data

Nov. 28, 2008  (KR) .................. 10-2008-0119274
Dec. 3, 2008   (KR) .................. 10-2008-0121895

(51) Int. Cl.
*H01L 27/148*    (2006.01)

(52) U.S. Cl.
USPC ....... 257/228; 257/433; 257/225; 257/E27.13

(58) Field of Classification Search
None
See application file for complete search history.

(56) References Cited

U.S. PATENT DOCUMENTS

| 6,849,921 | B2 * | 2/2005 | Uenishi ................ 257/536 |
| 7,358,512 | B1 * | 4/2008 | Lordi ................ 250/492.24 |
| 7,714,327 | B2 * | 5/2010 | Takechi et al. ........... 257/52 |
| 8,120,079 | B2 * | 2/2012 | Augusto ............... 257/292 |
| 8,187,909 | B2 * | 5/2012 | Venezia et al. .......... 438/72 |
| 8,253,176 | B2 * | 8/2012 | Wu et al. .............. 257/233 |
| 8,274,101 | B2 * | 9/2012 | Venezia et al. ......... 257/228 |
| 2001/0017378 | A1 * | 8/2001 | Lell .................. 257/186 |
| 2006/0068586 | A1 * | 3/2006 | Pain .................. 438/643 |
| 2006/0266930 | A1 | 11/2006 | Misawa |
| 2007/0152250 | A1 | 7/2007 | Kim |

(Continued)

FOREIGN PATENT DOCUMENTS

JP    2004-072253    3/2004
JP    2005-347707    12/2005

(Continued)

*Primary Examiner* — Jarrett Stark
(74) *Attorney, Agent, or Firm* — Harness, Dickey & Pierce

(57) ABSTRACT

The image sensor and an image sensing system including the same are provided. The image sensor includes a semiconductor substrate, a pixel array formed at a pixel area located in the semiconductor substrate and comprising a plurality of photoelectric converts, a plurality of driver circuits formed at a circuit area defined in the semiconductor substrate. The image sensor includes at least one heat blocker or heat shield. The at least one heat blocker may be formed between the pixel area and the circuit area in the semiconductor substrate. The heat blocker or heat shield may block or dissipate heat generated at the circuit area from being transferred to the pixel area through the semiconductor substrate. The heat blocker or heat shield may be used in image sensors using a back-side illumination sensor (BIS) structure or image sensors using a silicon on insulator (SOI) semiconductor substrate.

16 Claims, 7 Drawing Sheets

U.S. PATENT DOCUMENTS

| | | | |
|---|---|---|---|
| 2008/0099874 A1* | 5/2008 | Kumano | 257/506 |
| 2009/0173976 A1* | 7/2009 | Augusto | 257/292 |
| 2009/0315137 A1* | 12/2009 | Kwon et al. | 257/446 |
| 2010/0078795 A1* | 4/2010 | Dekker et al. | 257/690 |
| 2010/0148289 A1* | 6/2010 | McCarten et al. | 257/432 |
| 2011/0089517 A1* | 4/2011 | Venezia et al. | 257/447 |
| 2011/0180689 A1* | 7/2011 | Roy et al. | 250/208.1 |
| 2012/0028401 A1* | 2/2012 | De Munck et al. | 438/73 |
| 2012/0083066 A1* | 4/2012 | Kim | 438/73 |
| 2012/0178206 A1* | 7/2012 | Lee | 438/73 |
| 2012/0190168 A1* | 7/2012 | Kao | 438/424 |

FOREIGN PATENT DOCUMENTS

| | | |
|---|---|---|
| JP | 2006-019653 | 1/2006 |
| JP | 2006-339214 | 12/2006 |
| JP | 2007-184603 | 7/2007 |
| KR | 10-2003-0057609 | 7/2003 |
| KR | 10-0660714 | 12/2006 |

* cited by examiner

IMAGE SENSOR AND IMAGE SENSING SYSTEM INCLUDING THE SAME

CROSS-REFERENCE TO RELATED APPLICATIONS

This application claims priority from Korean Patent Application Nos. 10-2008-0119274 filed on Nov. 28, 2008, and 10-2008-0121895 filed on Dec. 3, 2008, the subject matter of which are hereby incorporated herein by reference.

BACKGROUND

Example Embodiments relate to an image pickup device, and more particularly, to a complementary metal-oxide semiconductor (CMOS) image sensor and a CMOS image sensing system including the same.

An image sensor is a device that converts an optical image into an electrical signal. With recent developments of the computer and communication industries, the demand on CMOS image sensors with improved performance is increasing in various fields such as digital camera, camcorders, personal communication systems (PCSs), game apparatuses, security cameras, medical micro cameras, and robots.

The CMOS image sensor may include a photodiode sensing external light and a circuit generating data by converting the light into an electrical signal. When the amount of light received by the photodiode increases, the photo sensitivity of the CMOS image sensor improves.

The CMOS image sensor may have a pixel area and a circuit area on or in a semiconductor substrate. The pixel area may include a plurality of photodiodes, a plurality of color filters formed corresponding to the respective photodiodes to transmit light of a desired (or alternatively predetermined) wavelength range, and a plurality of lenses formed corresponding to the respective color filters. The circuit area may include at least one driver circuit driving the CMOS image sensor.

Conventionally, CMOS image sensors may be manufactured in a backside illumination sensor (BIS) structure. However, when CMOS image sensors are made in the BIS structure, heat or noise generated at the driver circuit in the circuit area may be transferred to the pixel area through the semiconductor substrate. As a result, the temperature and the dark current of the photodiodes in the pixel area increase, which may cause inferiority such as dark shading in the image sensor. Moreover, the noise transferred from the circuit area to the pixel area may deteriorate the quality of picture in the image sensor.

SUMMARY

Example embodiments of the present invention may provide an image sensor for blocking heat from a circuit area.

Example embodiments of the present invention may also provide an image sensing system including the image sensor.

According to example embodiments of the present invention, there may be provided an image sensor including a semiconductor substrate, a pixel array formed at a pixel area defined in the semiconductor substrate and comprising a plurality of photoelectric converts. The image sensor may further include a plurality of driver circuits formed at a circuit area defined in the semiconductor substrate, and at least one heat blocker may be formed between the pixel area and the circuit area in the semiconductor substrate to block or dissipate heat generated at the circuit area from being transferred to the pixel area through the semiconductor substrate.

According to other embodiments of the present invention, there may be provided an image sensing system including an image sensor configured to sense light and to generate an image signal, a central processing unit (CPU) configured to control the image sensor, and a memory configured to store the image signal provided from the image sensor controlled by the CPU.

According to another embodiment, the image sensor may comprise at least one heat shield configured to shield photoelectric converters of the image sensor from heat generated by driver circuits of the image sensor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
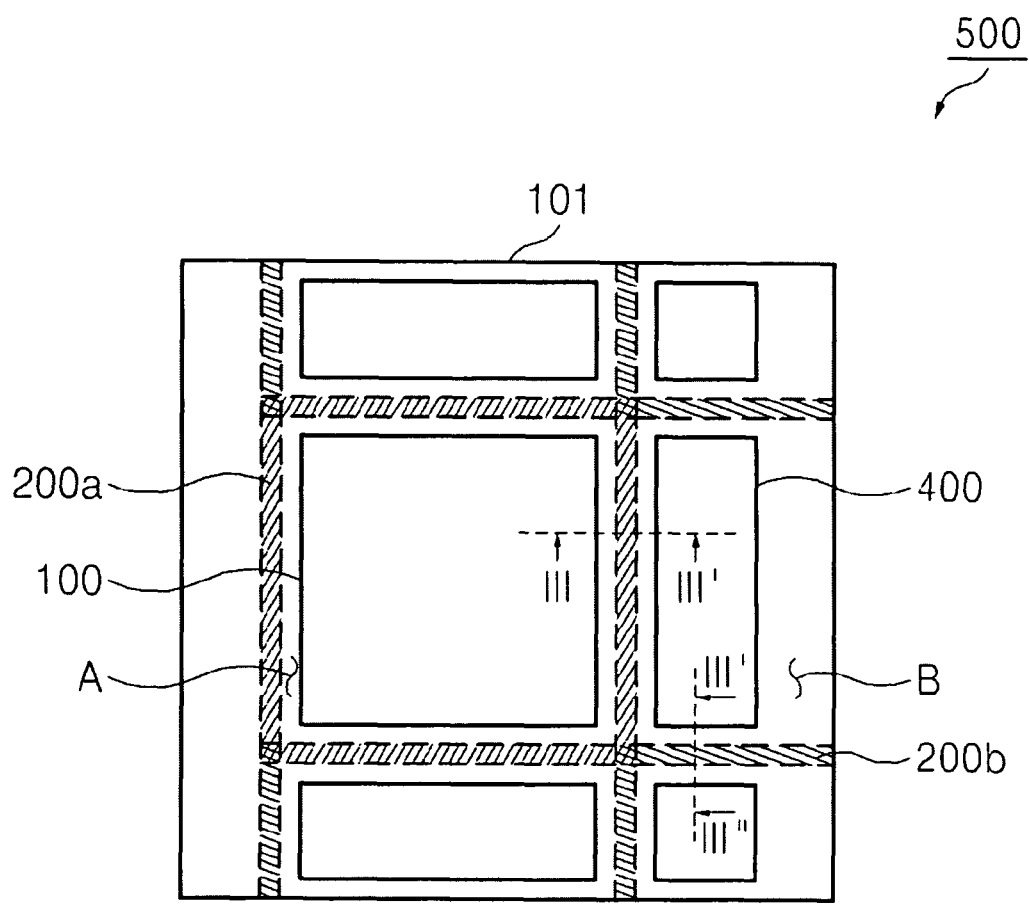
FIG. 1 is a schematic layout of an image sensor according to example embodiments of the present invention.

Example embodiments will now be described more fully with reference to the accompanying drawings, in which some example embodiments are shown. In the drawings, the thicknesses of layers and regions are exaggerated for clarity. Like reference numerals in the drawings denote like elements. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments, however, may be embodied in many alternate forms and should not be construed as limited to only the example embodiments set forth herein.

It should be understood, however, that there is no intent to limit the example embodiments to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 2:
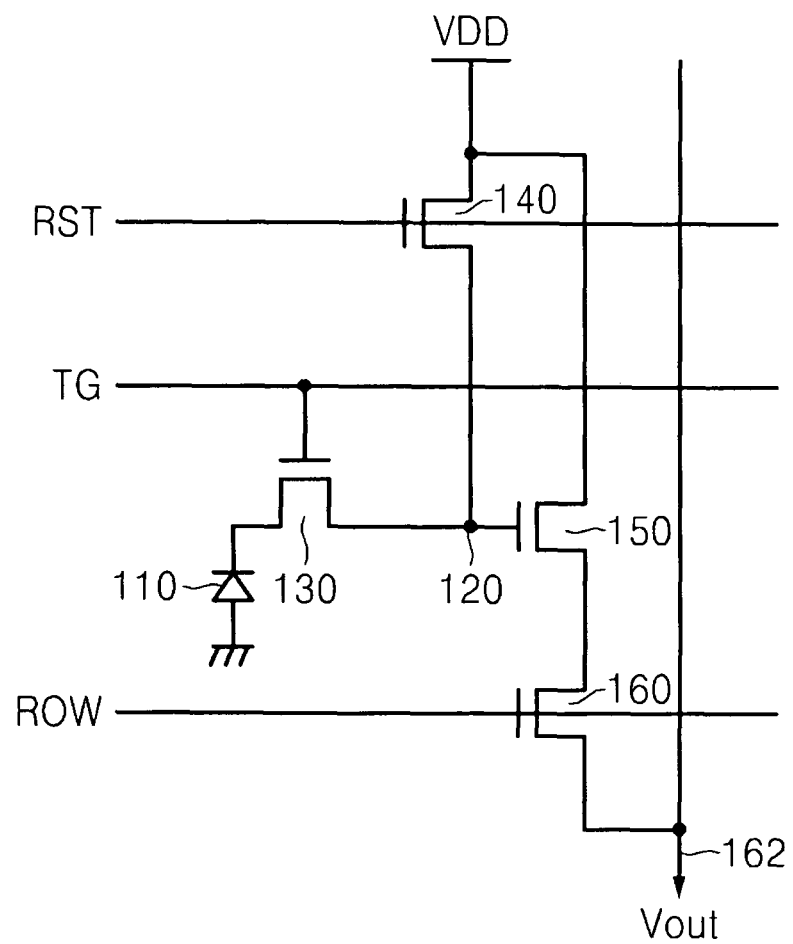
FIG. 2 is a circuit diagram of a unit pixel included in a pixel array illustrated in FIG. 1.

FIG. 1 is a schematic layout of an image sensor 500 according to example embodiments. FIG. 2 is a circuit diagram of a unit pixel included in a pixel array 100 illustrated in FIG. 1.

Referring to FIGS. 1 and 2, the image sensor 500 includes a pixel area A, a circuit area B, and at least one a heat blocker or heat shield 200a and 200b. In the pixel area A, a plurality of photoelectric converters may be arrayed to form the pixel array 100. The plurality of photoelectric converters may be arrayed in a matrix form.

The pixel array 100 absorbs incident light from the outside and accumulates electric charges corresponding to the amount of the light. The photoelectric converters included in the pixel array 100 may include a photodiode, a photo transistor, a photo gate, a pinned photodiode (PPD), or a combination thereof. In embodiments of the present invention, it is assumed that each photoelectric converter in the pixel array 100 may be implemented by a photodiode, but the present invention is not restricted to the current embodiments.

Referring to FIG. 2, the unit pixel in the pixel array 100 includes a photoelectric converter 110, a charge detector 120, a charge transmitter 130, a resetter 140, an amplifier 150, and a selector 160. In the current embodiments of the present invention, the unit pixel includes four transistors, but the unit pixel may include N (which is a natural number, e.g., 3 or 5) transistors in other embodiments of the present invention.

The photoelectric converter 110 absorbs incident light and accumulates electric charges corresponding to the amount of the incident light. The charge detector 120 may be implemented as a floating diffusion (FD) region and receives the electric charge accumulated by the photoelectric converter 110. Since the charge detector 120 has a parasitic capacitance, it may cumulatively store the electric charge. The charge detector 120 may be electrically connected to a gate of the amplifier 150, and thus controls the operation of the amplifier 150.

The charge transmitter 130 transmits the electric charges from the photoelectric converter 110 to the charge detector 120. The charge transmitter 130 may include a single transistor that may be controlled by a charge transmission signal TG. The resetter 140 periodically resets the charge detector 120. One terminal of the resetter 140 may be connected to the charge detector 120, and the other terminal thereof is connected to a power supply voltage VDD. In addition, the resetter 140 operates in response to a reset signal RST.

The amplifier 150 may be combined with a constant current source (not shown), which may be positioned outside the unit pixel, and functions as a source-follower buffer amplifier. A source of the amplifier 150 may be connected to a drain of the selector 160, and a drain may be connected to the power supply voltage VDD. The selector 160 selects the unit pixel to be read by row. The selector 160 operates in response to a row selection signal ROW, and a source of the selector 160 may be connected to the vertical signal (or column line) line 162. A voltage, which varies according to a voltage of the charge detector 120, is output to a vertical signal line 162.

Referring back to FIG. 1, a plurality of driver circuits 400 may be positioned in the circuit area B of the image sensor 500. The driver circuits 400 may include a row decoder (not shown), an analog-to-digital converter (ADC) (not shown), or a controller (not shown), but the present invention is not restricted thereto.

The circuit area B may be formed close to the pixel area A. Each driver circuit 400 may be formed on or in the same semiconductor substrate 101 as the pixel array 100 is formed. Each driver circuit 400 may output a driving signal for driving the pixel array 100 or a control signal for controlling the pixel array 100.

The heat (or noise) blocker or shield (200a and 200b) may be formed on or in the semiconductor substrate 101 to extend in a first direction or a second direction. The heat blocker or shield includes the first heat blocker or shield 200a physically isolating the pixel area A from the circuit area B and the second heat blocker or shield 200b physically isolating the driver circuits 400 in the circuit area B from each other.

The first heat blocker or shield 200a may be formed between the pixel area A and the circuit area B on the semiconductor substrate 101. In detail, the first heat blocker or shield 200a may be formed to surround the pixel area A so that the pixel area A is isolated from the circuit area B. The first heat blocker or shield 200a may prevent, reduce or alternatively dissipate heat or noise generated at the driver circuits 400 in the circuit area B from being transferred to the plurality of photoelectric converters in the pixel area A.

The second heat blocker or shield 200b may be formed in the circuit area B on the semiconductor substrate 101 to surround each of the driver circuits 400 so that the driver circuits 400 can be isolated from each other. The second heat blocker or shield 200b can prevent or dissipate heat or noise generated at each driver circuit 400 from being transferred to another adjacent driver circuit 400 in the circuit area B.

The first and second heat blockers or shields 200a and 200b may be formed by removing the semiconductor substrate 101 to a desired (or alternatively predetermined) width.

Figure 3:
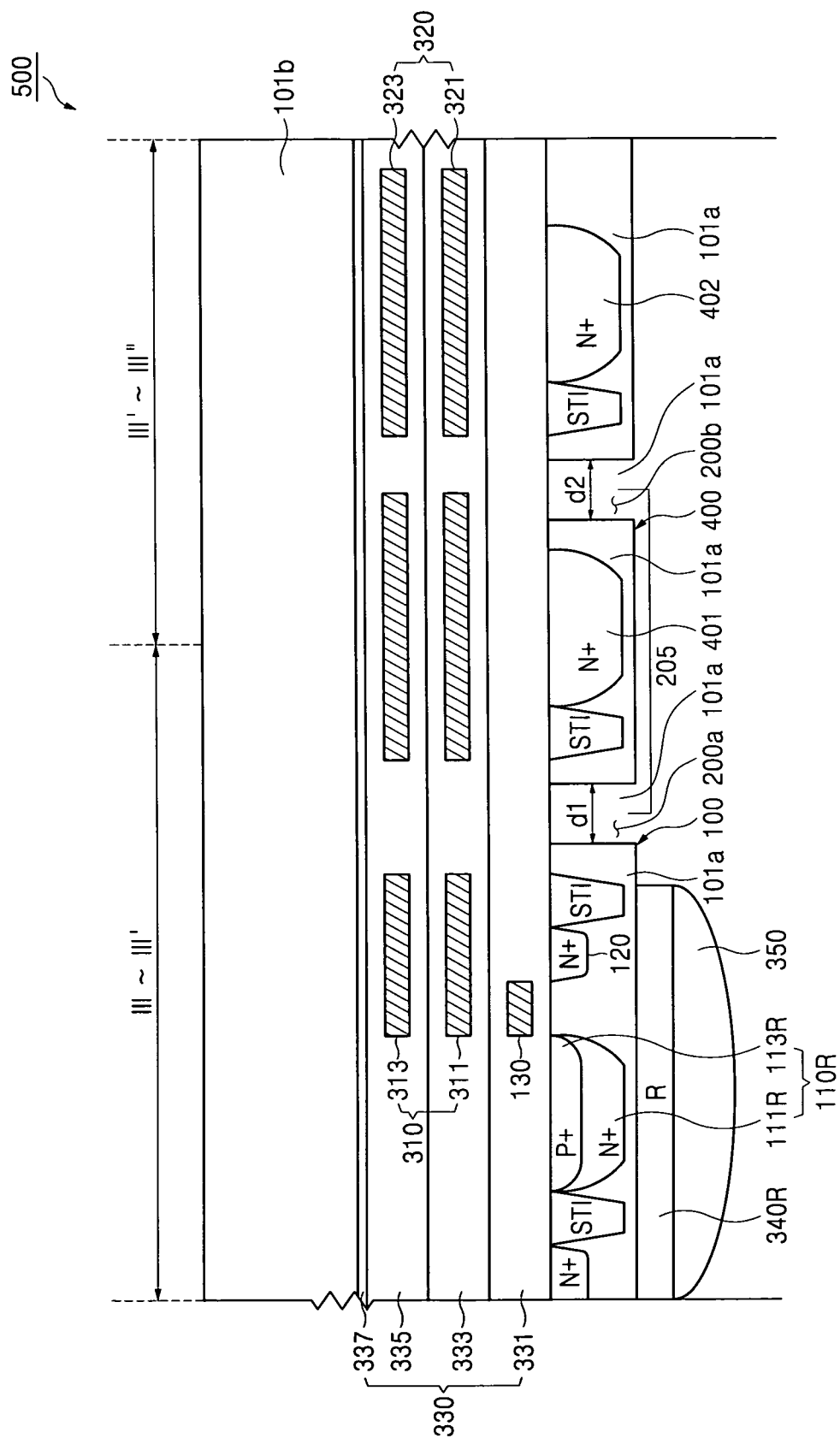
FIG. 3 is a sectional view of the image sensor illustrated in FIG. 1, taken along the line III-III' and the line III'-III"
Figure 4:
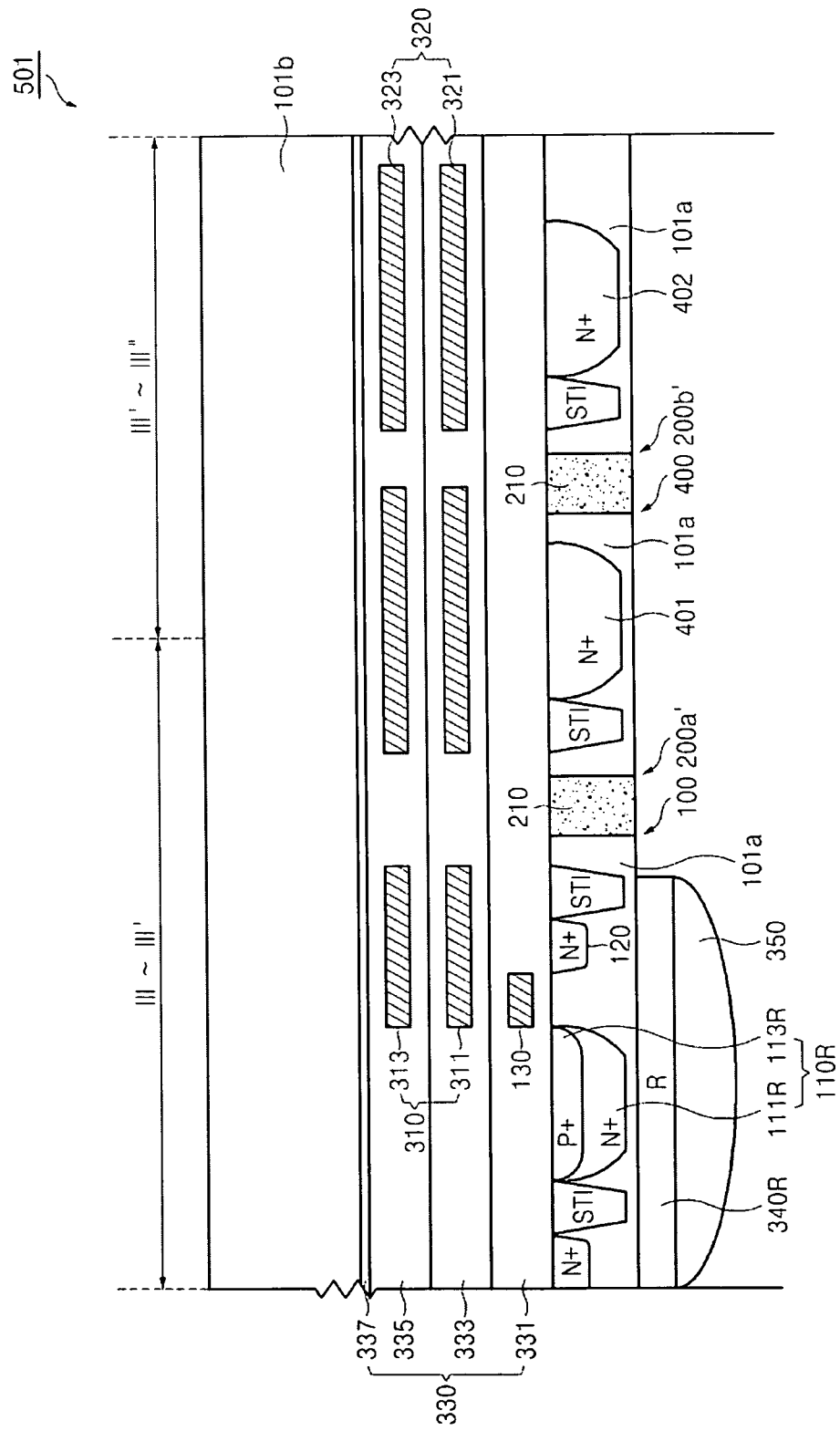
FIG. 4 is a sectional view of an image sensor according to other embodiments of the present invention, taken along the line III-III' and the line III'-III" illustrated in FIG. 1.

Hereinafter, an image sensor according to some embodiments of the present invention will be described in detail with reference to FIGS. 3 and 4. FIG. 3 is a sectional view of the image sensor 500 illustrated in FIG. 1, taken along the line III-III' and the line III'-III". FIG. 4 is a sectional view of an image sensor 501 according to other embodiments of the present invention, taken along the line III-III' and the line III'-III" illustrated in FIG. 1.

The image sensors 500 or 501 are assumed to be manufactured in a backside illumination sensor (BIS) structure, but the invention is not restricted to these embodiments. For instance, the image sensors 500 or 501 may be made in a front-side illumination sensor (FIS) structure using a silicon-on-insulator (SOI) semiconductor substrate.

Referring to FIGS. 1, 3, and 4, each of the image sensors 500 and 501 includes a first semiconductor substrate 101a in which the pixel area A and the circuit area B may be defined. Each of the image sensors 500 and 501 may also include a second semiconductor substrate 101b bonded to the first semiconductor substrate 101a. The second semiconductor substrate 101b may be thicker than the first semiconductor substrate 101a. A plurality of wiring patterns 310 and 320 may be formed between the first semiconductor substrate 101a and the second semiconductor substrate 101b to be surrounded by an insulating structure 330 including at least one insulating layer.

Referring to FIGS. 1 and 3, the pixel area A and the circuit area B may be defined in the first semiconductor substrate 101a. A photoelectric converter 110R may be made in the pixel area A to form the pixel array 100. One or more driver circuits, e.g., a first driver circuit 401 and a second driver circuit 402, may be formed in the circuit area B.

The photoelectric converter 110R formed in the pixel area A of the first semiconductor substrate 101a may include an N-type photodiode 111R and a P+ pinning layer 113R. The photoelectric converter 110R receives light from a micro lens 350, which is positioned at the back of the first semiconductor substrate 101a to correspond to the photoelectric converter 110R, and accumulates electric charges corresponding to the light.

The photoelectric converter 110R may be separated from another adjacent photoelectric converter (not shown) by a device isolation region formed in the first semiconductor substrate 101a. The device isolation region may be made of field oxide (FOX) using local oxidation of silicon (LOCOS) or may be made in a shallow trench isolation (STI).

The charge transmitter 130 may be formed above the photoelectric converter 110R. Transistors, which corresponds to the charge detector 120, the resetter 140, the amplifier 150, and the selector 160, may be formed in the pixel area A.

In the circuit area A of the first semiconductor substrate 101a, the first driver circuit 401 and the second driver circuit 402 may be formed. The first and second driver circuits 401 and 402 may be formed to be close to the photoelectric converter 110R.

Above the photoelectric converter 110R and the charge transmitter 130 in the pixel area A and above the first driver circuit 401 and the second driver circuit 402 in the circuit area B, the insulating structure 330 including at least one layer may be formed to cover the entire surface of the first semiconductor substrate 101a.

For instance, an interlayer insulating layer 331 may be formed above the photoelectric converter 110R, the charge transmitter 130, and the first and second driver circuits 401 and 402 to cover the surface of the first semiconductor substrate 101a. The interlayer insulating layer 331 may be made of a silicon oxide layer or a silicon nitride layer. The plurality of the wiring patterns 310 and 320 may be formed above the interlayer insulating layer 331. Each of the wiring patterns 310 and 320 may be made in a single-layer or multi-layer structure. In the current embodiments, the wiring patterns 310 and 320 include first wiring patterns 311 and 321, respectively, and second wiring patterns 313 and 323, respectively.

The wiring patterns 310 and 320 are formed in the pixel area A and the circuit area B, respectively, of the first semiconductor substrate 101a. In other words, the wiring pattern 310 may be formed above the photoelectric converter 110R in the pixel area A of the first semiconductor substrate 101a and the wiring pattern 320 may be formed above the first and second driver circuits 401 and 402 in the circuit area B of the first semiconductor substrate 101a. The first wiring patterns 311 and 313 are formed above the interlayer insulating layer 331. The wiring patterns 310 and 320 may be made of metals, such as aluminum (Al), tungsten (W), or copper (Cu).

A first metal interlayer insulating layer 333 may be formed on the interlayer insulating layer 331. It may be made of a silicon oxide layer or a silicon nitride layer. The second wiring patterns 313 and 323 are formed above the first metal interlayer insulating layer 333. The second wiring patterns 313 and 323 may be formed to be parallel with the first wiring patterns 311 and 313 and may be connected therewith through a via (not shown). The second wiring patterns 313 and 323 may be made of the same material as the first wiring patterns 311 and 313.

A second metal interlayer insulating layer 335 may be formed above or around the second wiring patterns 313 and 323 or on the first metal interlayer insulating layer 333. The second metal interlayer insulating layer 335 may be made of the same material as the first metal interlayer insulating layer 333. The first and second metal interlayer insulating layers 333 and 335 may be made of flowable oxide (FOX), high density plasma (HDP), tonen silazene (TOSZ), spin-on-glass (SOG), or undoped silica glass (USG).

A passivation layer 337 may be formed on the second metal interlayer insulating layer 335. The passivation layer 337 protects the wiring patterns 310 and 320, the photoelectric converter 110R, and the first and second driver circuits 401 and 402. The passivation layer 337 may be made of an insulant such as a nitride or a silicon nitride.

The second semiconductor substrate 101b may be bonded to the passivation layer 337. The second semiconductor substrate 101b may be made of the same material as the first semiconductor substrate 101a.

The first semiconductor substrate 101a may be ground or etched to a desired (or alternatively predetermined) thickness. Since the image sensor 500 has a BIS structure to which incident light from an outside source may enter through the back surface of the first semiconductor substrate 101a, the first semiconductor substrate 101a may be ground or removed to the desired (or alternatively predetermined) thickness in order to enhance the photosensitivity of the photoelectric converter 110R. Accordingly, the first semiconductor substrate 101a may be thinner than the second semiconductor substrate 101b. For instance, the first semiconductor substrate 101a may be ground to a thickness of about 10 μm or less.

A color filter, for example, a red color filter 340R may be formed at the bottom of the first semiconductor substrate 101a, and more particularly, on the back surface of the first semiconductor substrate 101a in the pixel area A in which the photoelectric converter 110R is formed. On the back of the red color filter 340R, the micro lens 350 may be formed at a position corresponding to the photoelectric converter 110R. The micro lens 350 may be made of resin, such as a TMR resin or MFR resin.

The heat blocker or shield may include the first heat blocker or shield 200a and the second heat blocker or shield 200b. The heat blocker or shield 205 may be formed between the pixel area A and the circuit area B in the first semiconductor substrate 101a or between the first driver circuit 401 and the second driver circuit 402 in the circuit area B. The heat blocker or shield 205 may prevent, reduce or dissipate heat or noise generated at the first driver circuit 401 in the circuit area B from being transferred to the photoelectric converter 110R in the pixel area A and may also prevent, reduce or dissipate heat generated at the second driver circuit 402 from being transferred to the first driver circuit 401.

The first heat blocker or shield 200a may physically separate the pixel area A from the circuit area B in the first semiconductor substrate 101a. The first heat blocker 200a may be formed by etching the first semiconductor substrate 101a between the pixel area A and the circuit area B to a desired (or alternatively predetermined) width d1. The first heat blocker or shield 200a may have a removed width d1 of about 1 to 10 μm and may have a removed depth which is the same as the thickness of the first semiconductor substrate 101a. The first heat blocker or shield 200a may prevent, reduce or dissipate heat or noise generated at the first driver circuit 401 in the circuit area B from being transferred to the pixel area A through the first semiconductor substrate 101a, thereby protecting the operation of the photoelectric converter 110R in the pixel area A. The first heat blocker or shield 200a may be filled with air.

The second heat blocker or shield 200b may physically separate the first driver circuit 401 from the second driver circuit 402 in the circuit area B of the first semiconductor substrate 101a. The second heat blocker 200b may be formed by removing the first semiconductor substrate 101a between the first driver circuit 401 and the second driver circuit 402 to a desired or alternatively predetermined width d2. The second heat blocker or shield 200b may have a removed width d2 of about 1 to 10 μm and may have a removed depth which is the same as the thickness of the first semiconductor substrate 101a. The second heat blocker 200b may prevent heat or noise generated at the second driver circuit 402 in the circuit area B from being transferred to the first driver circuit 401 through the first semiconductor substrate 101a, thereby protecting the operation of the first driver circuit 401. The second heat blocker or shield 200b may be filled with air.

Referring to FIG. 4, the image sensor 501 has the same structure as that of the image sensor 500 illustrated in FIG. 3 with just one exception. For instance, in the image sensor 501 illustrated in FIG. 4, first and second heat blockers or shields 200a' and 200b' may be filled with an oxide material 210, for example, having a lower conductivity (e.g., a lower heat conductivity) than the material of the first semiconductor substrate 101a.

In other words, in the embodiments illustrated in FIG. 4, the first and second heat blockers or shields 200a' and 200b' may be formed in the first semiconductor substrate 101a and then filled with the oxide material 210 having a low conductivity. Accordingly, the first heat blocker or shield 200a' may prevent, reduce or dissipate heat or noise generated at the first driver circuit 401 in the circuit area B from being transferred to the pixel area A through the first semiconductor substrate 101a and the second heat blocker or shield 200b' can prevent, reduce or dissipate heat or noise generated at the second driver circuit 402 in the circuit area B from being transferred to the first driver circuit 401 through the first semiconductor substrate 101a.

Each of the first and second heat blockers or shields 200a' and 200b' may be formed by removing the first semiconductor substrate 101a to a desired (or alternatively predetermined) width, e.g., the removed width d1 or d2 of 1 to 10 μm, and to a removed depth which is the same as the thickness of the first semiconductor substrate 101a. In the embodiments illustrated in FIG. 4, the first and second heat blockers or shields 200a' and 200b' are filled with the oxide material 210, but the invention is not restricted to these embodiments. For instance, the first and second heat blockers or shields 200a' and 200b' may be filled with any material having a lower conductivity than the first semiconductor substrate 101a.

The other elements, e.g., the photoelectric converter 110, the first driver circuit 401, the second driver circuit 402, the insulating structure 330, the wiring patterns 310 and 320, and the second semiconductor substrate 101b, of the image sensor 501 illustrated in FIG. 4 are the same as those of the image sensor 500 illustrated in FIG. 3, and therefore, a detailed description thereof will be omitted.

Figure 5:
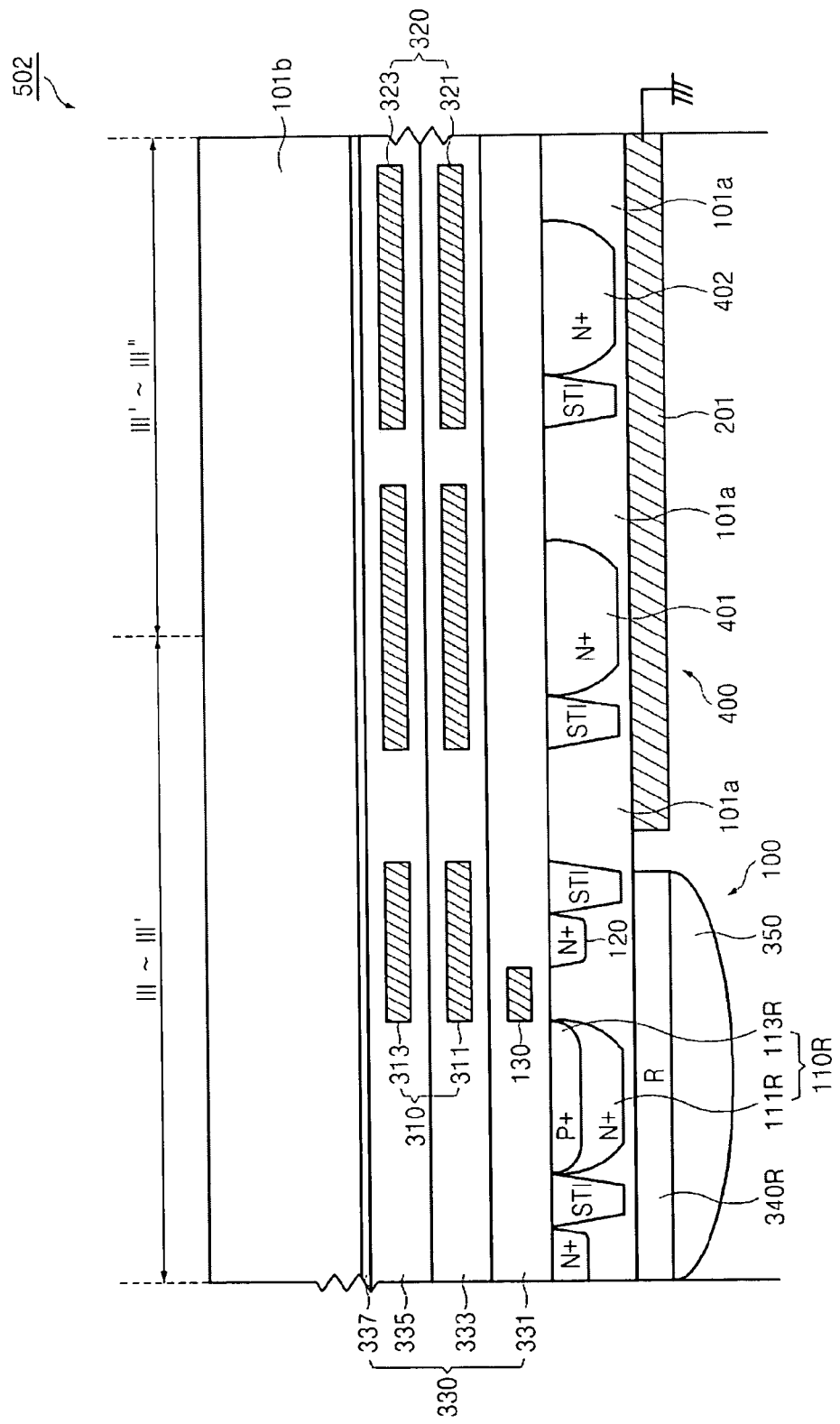
FIG. 5 is a sectional view of an image sensor according to further embodiments of the present invention, taken along the line III-III' and the line III'-III" illustrated in FIG. 1.
Figure 6:
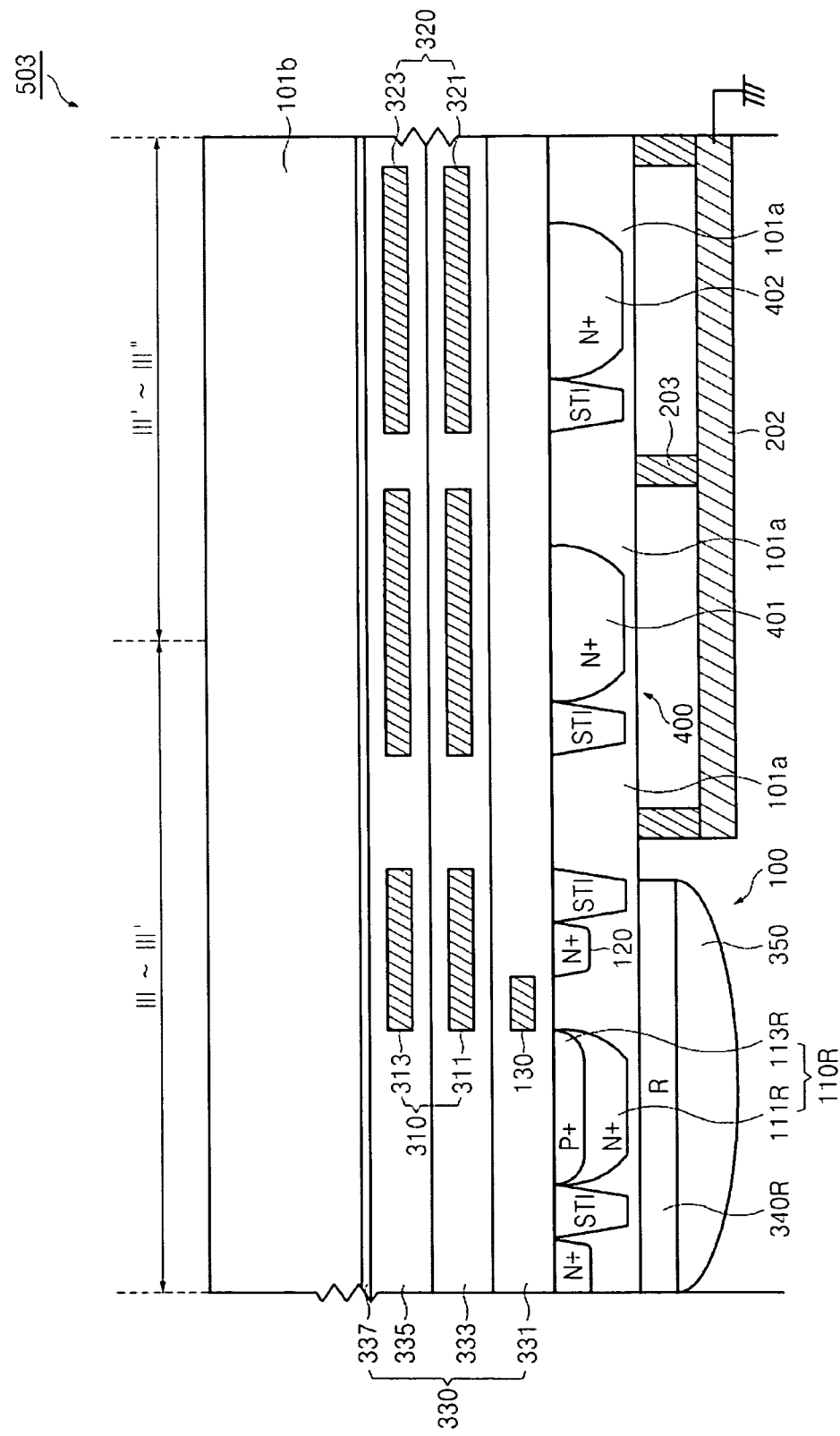
FIG. 6 is a sectional view of an image sensor according to other embodiments of the present invention, taken along the line III-III' and the line III'-III" illustrated in FIG. 1.

FIG. 5 is a sectional view of an image sensor 502 according to further embodiments, taken along the line III-III' and the line III'-III'' illustrated in FIG. 1. FIG. 6 is a sectional view of an image sensor 503 according to other, taken along the line III-III' and the line III'-III'' illustrated in FIG. 1. The image sensors 502 and 503 illustrated in FIGS. 5 and 6, respectively, have the same structure as that of the image sensor 500 illustrated in FIG. 3 with just one exception.

Referring to FIGS. 1 and 5, the image sensor 502 includes a heat blocker 201 connected or bonded to the circuit area B of the first semiconductor substrate 101a. The heat blocker or shield 201 may be a metal layer deposited on the first semiconductor substrate 101a to a desired (or alternatively predetermined) thickness.

The heat blocker or shield 201 may be formed of a metal material having a higher conductivity (e.g., a higher heat conductivity) than the material of the first semiconductor substrate 101a. For instance, the heat blocker or shield 201 may be formed of copper (Cu) or aluminum (Al), but embodiments are not restricted thereto. The heat blocker or shield 201 may emit, dissipate or discharge heat generated at the circuit area B out of the first semiconductor substrate 101a.

For instance, the image sensor 502 may be packaged with a sealing material such as an epoxy molding compound (EMC) and the packaged image sensor 502 may include a plurality of pads (not shown) connected to an outside. The heat blocker or shield 201 may be connected with at least one pad connected to an external ground among the plurality of pads, for example, through a bonding wire (not shown). Accordingly, heat generated at the circuit area B of the first semiconductor substrate 101a can be emitted or discharged out of the image sensor 502 through the heat blocker or shield 201, the bonding wire, and the at least one pad. In addition, since the heat blocker or shield 201 is connected to the external ground through the at least one pad, the total grounding area of the image sensor 502 is increased.

The heat blocker or shield 201 may emit, dissipate or discharge heat generated at the circuit area B of the first semiconductor substrate 101a and also increase the total grounding area of the image sensor 502 through the connection with the external ground. The plurality of pads included in the image sensor 502 may be connection pins or solder balls. Although not shown, a required (or alternatively predetermined) protective layer may also be formed between the heat blocker 201 and the first semiconductor substrate 101a. The protective layer may transmit the heat generated at the circuit area B of the first semiconductor substrate 101a to the heat blocker or shield 201.

Referring to FIGS. 1 and 6, the image sensor 503 may include a heat blocker or shield 202 connected to the circuit area B of the first semiconductor substrate 101a. The heat blocker or shield 202 may be a metal layer formed on the first semiconductor substrate 101a to a required (or alternatively predetermined) thickness. The heat blocker or shield 202 may be separated from the first semiconductor substrate 101a by a required (or alternatively predetermined) gap and may be connected to the first semiconductor substrate 101a through at least one contact 203.

The heat blocker or shield 202 may be formed of a metal layer separated from the first semiconductor substrate 101a by the required (or alternatively predetermined) gap and may be connected to the circuit area B of the first semiconductor substrate 101a through the at least one contact 203. At this time, the heat blocker or shield 202 and at least one contact 203 may be made of a metal material having a higher conductivity (e.g., a higher heat conductivity) than the material of the first semiconductor substrate 101a. The metal material may be copper (Cu) or aluminum (Al).

Although not shown, a required (or alternatively predetermined) protective layer may also be formed between the first semiconductor substrate 101a and at least one contact 203. The protective layer may transmit heat generated at the circuit area B of the first semiconductor substrate 101a to the at least one contact 203. The heat blocker or shield 202 may emit, dissipate or discharge the heat generated at the circuit area B of the first semiconductor substrate 101a and may be connected to an external ground.

The image sensor 503 may be packaged with a sealing material such as an EMC and the packaged image sensor 503 may include a plurality of pads (not shown) connected to an outside. The heat blocker or shield 202 may be connected with at least one pad connected to the external ground among the plurality of pads through a bonding wire (not shown). Accordingly, heat generated at the circuit area B of the first semiconductor substrate 101a may be discharged or dissipated out of the image sensor 503 through the contact 203, the heat blocker or shield 202, the bonding wire, and the at least one pad. In addition, since the heat blocker or shield 202 may be connected to the external ground through the at least one pad, the total grounding area of the image sensor 503 may be increased.

The other elements, e.g., the photoelectric converter 110, the first driver circuit 401, the second driver circuit 402, the insulating structure 330, the wiring patterns 310 and 320, and the second semiconductor substrate 101b, of the image sensors 502 and 503 illustrated in FIGS. 5 and 6 are the same as those of the image sensor 500 illustrated in FIG. 3, and therefore, a detailed description thereof will be omitted.

Figure 7:
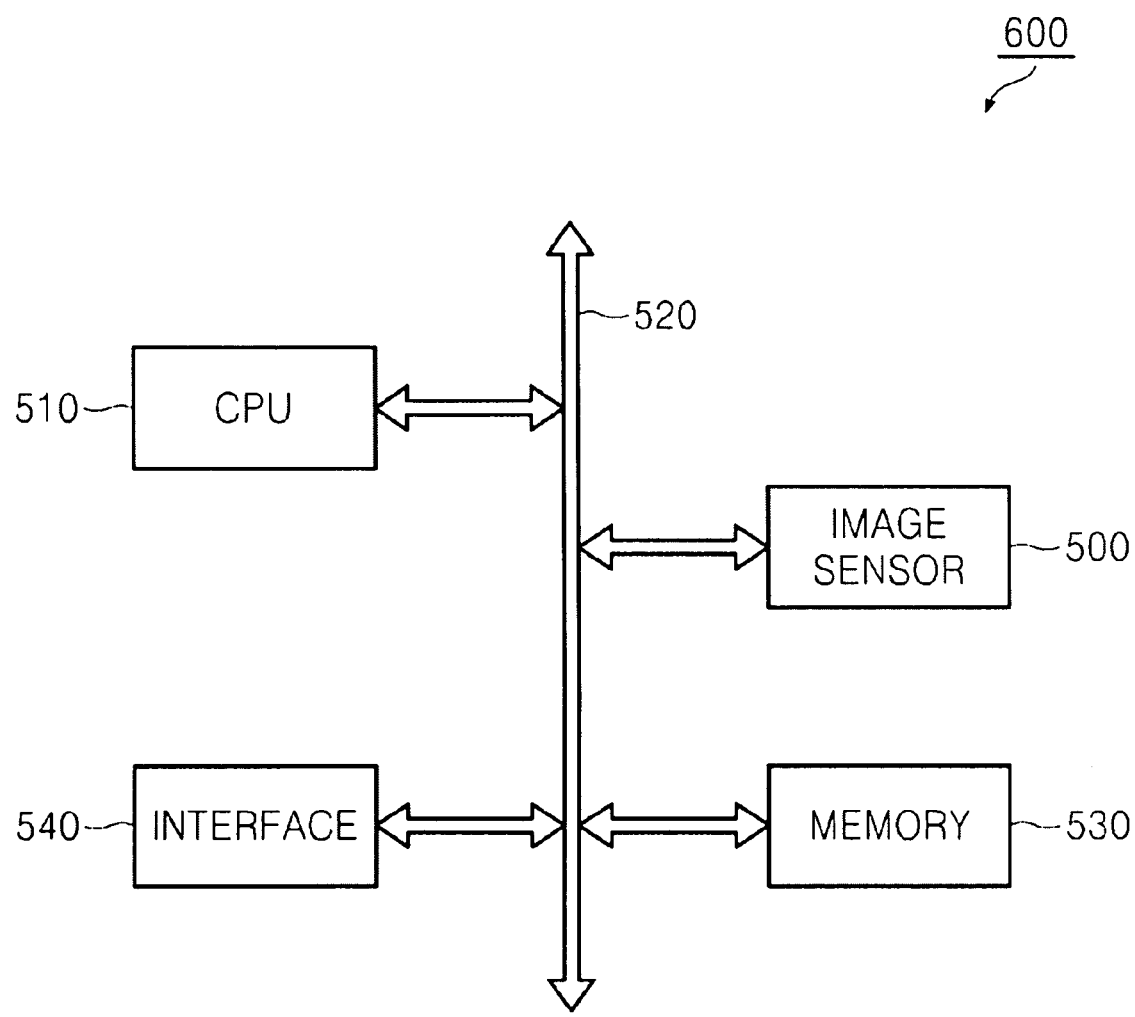
FIG. 7 is a schematic diagram of an image sensing system including an image sensor according to some embodiments of the present invention.

FIG. 7 is a schematic diagram of an image sensing system 600 including the image sensor 500 according to example embodiments of the present invention. In the current embodiments of the present invention, the image sensing system 600 includes the image sensor 500 illustrated in FIG. 3, but the image sensing system 600 may include the image sensor 501, 502, or 503 illustrated in FIGS. 4 through 6, respectively.

The image sensing system 600 may be a computer system, a camera system, a scanner, a mechanized clock system, a navigation system, a videophone, a supervisory system, an auto-focus system, a tracking system, a motion monitoring system, or an image stabilization system. However, the image sensing system 600 is not limited thereto.

Referring to FIG. 7, the image sensing system 600 such as a computer system includes a bus 520, a central processing unit (CPU) 510, the image sensor 500, and a memory 530. The image sensing system 600 may also include an interface 540 connected to the bus 520 to communicate with an outside. The interface may be an input/output (I/O) interface and/or a wireless interface.

The CPU 510 may generate a control signal for controlling the image sensor 500 and send the control signal to the image sensor 500 through the bus 520. The image sensor 500 may, as described above with reference to FIGS. 1 through 3, include the pixel array 100 and the at least one driver circuit 400. The image sensor 500 may sense light in response to the control signal from the CPU 510 and convert the light into an electrical signal, thereby generating an image signal. The memory 530 may receive the image signal from the image sensor 500 through the bus 520 and store the image signal.

The image sensor 500 may be integrated with the CPU 510 and the memory 530. In some embodiments, the image sensor 500 may be integrated with a digital signal processor (DSP) or may be formed on a separate chip on its own.

According to embodiments of the present invention, a heat blocker or shield may be formed between a pixel area and a circuit area in an image sensor, thereby preventing heat generated at the circuit area from being transferred to the pixel area. As a result, the operating efficient of the image sensor can be increased.

While the example embodiments have been particularly shown and described, it will be understood by those of ordinary skill in the art that various changes in forms and details may be made therein without departing from the spirit and scope of the present invention as defined by the following claims.

What is claimed is:

1. An image sensor comprising:
   a semiconductor substrate having a pixel area and a circuit area adjacent to the pixel area on the substrate;
   a pixel array formed at the pixel area in the semiconductor substrate and including a plurality of photoelectric converters;
   a plurality of driver circuits formed at the circuit area in the semiconductor substrate;
   at least one heat blocker configured to at least one of block and dissipate heat generated at the circuit area from being transferred to the pixel area through the semiconductor substrate, the at least one heat blocker including a trench formed between the pixel area and the circuit area such that the trench surrounds the pixel array; and
   a micro lens disposed entirely on the pixel area such that the micro lens does not overlap the at least one heat blocker.

2. The image sensor of claim 1, wherein the at least one heat blocker is further formed among the plurality of the driver circuits in the circuit area of the semiconductor substrate.

3. The image sensor of claim 1, wherein the at least one heat blocker is formed by etching the semiconductor substrate to a width of 1 to 10 μm.

4. The image sensor of claim 1, wherein the at least one heat blocker is formed by etching the semiconductor substrate and filling an etched portion of the semiconductor substrate with an oxide material.

5. The image sensor of claim 1, wherein the at least one heat blocker is a metal layer formed on the semiconductor substrate to contact the circuit area.

6. The image sensor of claim 5, wherein the metal layer includes one of copper and aluminum.

7. The image sensor of claim 5, wherein the metal layer is connected to an external ground.

8. The image sensor of claim 1, wherein the at least one heat blocker is a metal layer positioned separated from the semiconductor substrate and is connected to the circuit area of the semiconductor substrate through at least one contact.

9. An image sensor comprising:
   a first semiconductor substrate having a pixel area and a circuit area adjacent to the pixel area on the first substrate;
   a photoelectric converter formed in the pixel area of the first semiconductor substrate;
   a plurality of driver circuits formed in the circuit area of the first semiconductor substrate;
   at least one heat blocker is configured to block heat generated at the driver circuits from being transferred to the photoelectric converter, the at least one heat blocker including a trench formed between the pixel area and the circuit area of the first semiconductor substrate such that the trench surrounds the photoelectric converter;

a micro lens disposed over the pixel area of the first semiconductor substrate such that the micro lens does not overlap the at least one heat blocker;

a wiring pattern formed on the first semiconductor substrate; and a second semiconductor substrate bonded on to the wiring pattern and having a greater thickness than the first semiconductor substrate.

10. The image sensor of claim 9, wherein the at least one heat blocker is further formed between each driver circuit of the plurality of driver circuits in the circuit area of the first semiconductor substrate.

11. The image sensor of claim 9, wherein the at least one heat blocker is formed by etching the first semiconductor substrate to a width of 1 to 10 μm.

12. The image sensor of claim 9, wherein the at least one heat blocker is formed by etching the first semiconductor substrate between the pixel area and the circuit area to form an etched portion and filling the etched portion with an oxide material.

13. The image sensor of claim 9, wherein the at least one heat blocker is a metal layer formed on the first semiconductor substrate between the pixel area and the circuit area to be connected with the driver circuits.

14. The image sensor of claim 12, wherein the metal layer is connected to an external ground.

15. The image sensor of claim 9, wherein the at least one heat blocker is a metal layer positioned to be separated from the first semiconductor substrate and is connected to the driver circuits in the first semiconductor substrate through at least one contact.

16. An image sensor having photo electric converters disposed in a pixel area of a semiconductor substrate, a micro lens disposed over the pixel area and driver circuits disposed in a circuit area of the semiconductor substrate, the image sensor comprising:

at least one heat shield configured to shield the photo electric converters from heat generated by the driver circuits, the at least one heat shield including a trench formed between the pixel area and the circuit area such that the trench surrounds the photoelectric converters and the micro lens does not overlap the at least one heat shield.

* * * * *